(12) United States Patent
Shin et al.

(10) Patent No.: US 9,291,870 B2
(45) Date of Patent: Mar. 22, 2016

(54) THIN FILM TRANSISTOR AND DISPLAY DEVICE HAVING THE SAME

(71) Applicant: SAMSUNG DISPLAY CO., LTD., Yongin, Gyeonggi-Do (KR)

(72) Inventors: Young Jun Shin, Seongnam-si (KR); Jeehoon Kim, Cheonan-si (KR); Sehun Park, Asan-si (KR); Jaehwan Oh, Cheonan-si (KR); Guanghai Kim, Seoul (KR); Byoungki Kim, Seoul (KR); Wonkyu Lee, Seoul (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/462,863

(22) Filed: Aug. 19, 2014

(65) Prior Publication Data
US 2015/0123099 A1  May 7, 2015

(30) Foreign Application Priority Data
Nov. 7, 2013  (KR) .......................... 10-2013-0134982

(51) Int. Cl.

| | | |
|---|---|---|
| *H01L 27/32* | (2006.01) | |
| *H01L 29/423* | (2006.01) | |
| *H01L 29/417* | (2006.01) | |
| *H01L 23/36* | (2006.01) | |
| *G02F 1/1362* | (2006.01) | |
| *H01L 23/367* | (2006.01) | |

(52) U.S. Cl.
CPC ...... *G02F 1/136213* (2013.01); *H01L 23/3677* (2013.01); *H01L 29/41733* (2013.01); *H01L 29/42384* (2013.01); *H01L 2924/0002* (2013.01)

(58) Field of Classification Search
CPC .............. H01L 27/1214; H01L 27/124; H01L 29/7869; H01L 27/3244; H01L 29/78696; H01L 29/42384; H01L 2225/06589; H01L 27/3274; H01L 27/3288; H01L 23/3677; H01L 29/41733; G02F 1/136213
See application file for complete search history.

(56) References Cited

U.S. PATENT DOCUMENTS

| 7,436,463 B2 | 10/2008 | Yamazaki | |
|---|---|---|---|
| 2008/0174539 A1* | 7/2008 | Hu et al. .......................... | 345/99 |
| 2009/0078939 A1* | 3/2009 | Yamazaki et al. .............. | 257/59 |

FOREIGN PATENT DOCUMENTS

| JP | 2003-140185 A | 5/2003 |
|---|---|---|
| JP | 2005-092122 A | 4/2005 |

(Continued)

OTHER PUBLICATIONS

Shen-De Wang et al, CF4 Plasma Treatment for Fabricating High-Performance and Reliable Solid-Phase-Crystallized Poly-Si TFTs, 2005, Journal of the Electrochemical Society, 152, G703-G706.*

(Continued)

*Primary Examiner* — Whitney T Moore
(74) *Attorney, Agent, or Firm* — Lee & Morse, P.C.

(57) ABSTRACT

A thin film transistor includes a semiconductor pattern on a base substrate, the semiconductor pattern including an input area, an output area, and a channel area between the input area and the output area, a first insulating layer covering the semiconductor pattern, a control electrode on the first insulating layer, the control electrode overlapping the channel area, a second insulating layer covering the control electrode, an input electrode connected to the input area, an output electrode connected to the output area, and a heat discharge electrode on the second insulating layer, the heat discharge electrode being connected to the control electrode.

9 Claims, 10 Drawing Sheets

(56) References Cited

FOREIGN PATENT DOCUMENTS

KR    10-2010-0096942 A    9/2010
KR    10-2010-0096943 A    9/2010

OTHER PUBLICATIONS

Han-Wook Hwang et al, A novel structured polysilicon thin-film transistor that increases the on/off current ratio, 2003, Institute of Physics Publishing Semiconductor Sciences and Technology, 18, 845-849.*

Wei Zhou et al, Bridged-Grain Solid-Phase-Crystallized Polycrystalline-Silicon Thin-Film Transistors, Oct. 2012, IEEE Electrons Device Letters, vol. 33, No. 10, 1414-1416.*

G. Fortunato, et al.; Self-Heating Effects in p-Channel Polysilicaon TFTs Fabricated on Different Substrates; Journal of the Korean Physical Society, vol. 54, No. 1; Jan. 2009; pp. 455-462.

* cited by examiner

THIN FILM TRANSISTOR AND DISPLAY DEVICE HAVING THE SAME

CROSS-REFERENCE TO RELATED APPLICATION

Korean Patent Application No. 10-2013-0134982 filed on Nov. 7, 2013, in the Korean Intellectual Property Office, and entitled: "THIN FILM TRANSISTOR AND DISPLAY DEVICE HAVING THE SAME," is incorporated by reference herein in its entirety.

BACKGROUND

1. Field

The present disclosure relates to a thin film transistor and a display device having the same. More particularly, the present disclosure relates to a thin film transistor having improved heat-discharge characteristic and a display device having the thin film transistor.

2. Description of the Related Art

A display device includes at least one base substrate and a plurality of pixels arranged on the base substrate. The base substrate includes a plurality of pixel areas and a peripheral area disposed adjacent to the pixel areas. The pixels are disposed to respectively correspond to the pixel areas.

Each pixel includes a display element and a circuit part to control the display element. The display element is driven in response to a signal provided from the circuit part.

SUMMARY

Embodiments provide a thin film transistor including a semiconductor pattern on a base substrate, the semiconductor pattern including an input area, an output area, and a channel area between the input area and the output area, a first insulating layer covering the semiconductor pattern, a control electrode on the first insulating layer, the control electrode overlapping the channel area, a second insulating layer covering the control electrode, an input electrode connected to the input area, an output electrode connected to the output area, and a heat discharge electrode on the second insulating layer, the heat discharge electrode being connected to the control electrode.

The heat discharge electrode is connected to the control electrode through a contact hole defined in the second insulating layer.

The input electrode and the output electrode are disposed on the second insulating layer. The input electrode and the output electrode are respectively connected to the input area and the output area through contact holes defined in the first insulating layer and the second insulating layer.

The heat discharge electrode is disposed between the input electrode and the output electrode on the second insulating layer and spaced apart from the input electrode and the output electrode.

The heat discharge electrode, the input electrode, and the output electrode include the same material.

Embodiments provide a display device including a plurality of pixels. Each of the pixels includes a display element and a thin film transistor that applies an electrical signal to the display element. The thin film transistor has the above-mentioned structure.

The display device is an organic light emitting display device or a liquid crystal display device. The organic light emitting display device includes an organic light emitting diode, a first thin film transistor, a second thin film transistor, and a capacitor.

The first thin film transistor outputs a pixel voltage in response to a gate voltage. The second thin film transistor is turned on in response to the pixel voltage to control a driving current flowing through the organic light emitting diode. The capacitor is connected to the first thin film transistor and the second thin film transistor to control a turn-on period of the second thin film transistor. At least one of the first and second thin film transistors has the above-mentioned structure.

The liquid crystal display device includes a liquid crystal capacitor connected to one of the above-mentioned thin film transistors.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

It will be understood that when an element or layer is referred to as being "on", "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present embodiments.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments will be explained in detail with reference to the accompanying drawings.

Figure 1:
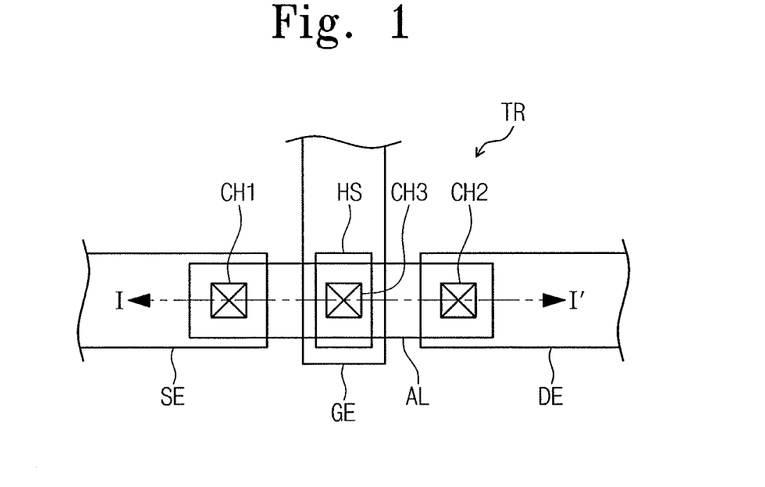
FIG. 1 illustrates a plan view showing a thin film transistor according to an exemplary embodiment of the present disclosure.
Figure 2:
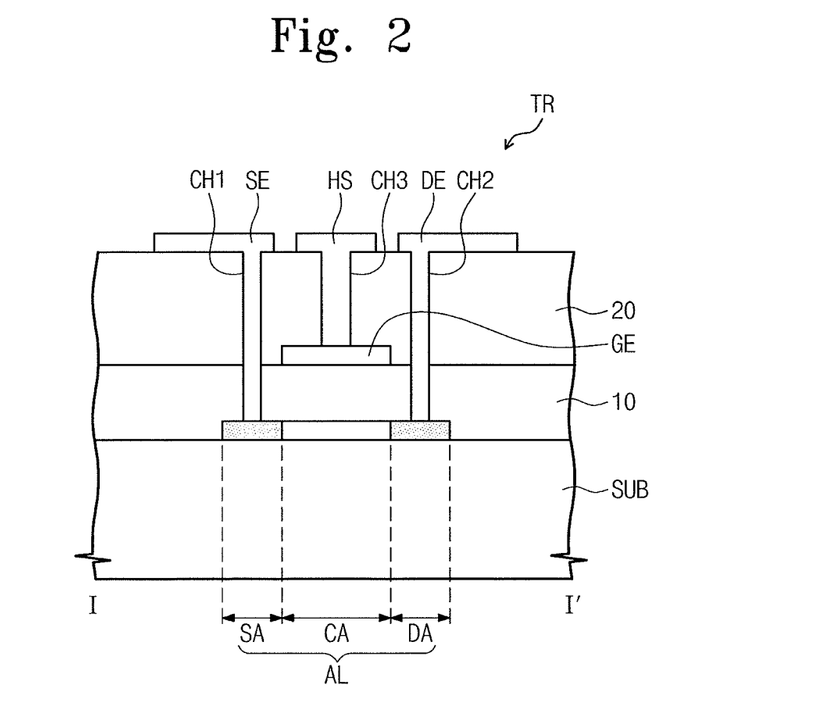
FIG. 2 illustrates a cross-sectional view showing the thin film transistor shown in FIG. 1.

FIG. 1 is a plan view showing a thin film transistor according to an exemplary embodiment of the present disclosure, and FIG. 2 is a cross-sectional view showing the thin film transistor shown in FIG. 1.

Referring to FIGS. 1 and 2, a thin film transistor TR may include a control electrode GE, an input electrode SE, a semiconductor pattern AL, an output electrode DE, and a heat discharge electrode HS. In the present exemplary embodiment, a p-type MOS thin film transistor will be described as the thin film transistor TR. The control electrode GE, the input electrode SE, and the output electrode DE will be described as a gate electrode, a source electrode, and a drain electrode, respectively. According to another embodiment, the thin film transistor TR may be an n-type MOS thin film transistor.

The semiconductor pattern AL is disposed on a base substrate SUB. The semiconductor pattern AL may be directly disposed on one surface of the base substrate SUB, but it should not be limited thereto or thereby. That is, the semiconductor pattern AL may be disposed on a buffer layer (not shown) disposed on the surface of the base substrate SUB.

The semiconductor pattern AL may include amorphous silicon or polysilicon. In addition, the semiconductor pattern AL may include metal oxide semiconductor. The semiconductor pattern AL includes an input area SA, a channel area CA, and an output area DA. Hereinafter, the input area SA and the output area DA will be referred to as a source area and a drain area, respectively.

When viewed in a plan view, the channel area CA is disposed between the source area SA and the drain area DA. The source area SA and the drain area DA may include dopants. The channel area CA is an intrinsic semiconductor or includes dopants. The channel area CA has a doping concentration different from those of the source area SA and the drain area DA.

A first insulating layer 10 is disposed on the base substrate SUB to cover the semiconductor pattern AL. The first insulating layer 10 may include an inorganic material, e.g., silicon oxide ($SiO_x$) or silicon nitride ($SiN_x$). The first insulating layer 10 may include a plurality of thin film layers stacked one on another. For instance, the first insulating layer 10 may include a silicon oxide ($SiO_x$) thin film layer, a silicon nitride ($SiN_x$) thin film layer, and a silicon oxide ($SiO_x$) thin film layer, which are stacked one on another.

The gate electrode GE is disposed on the first insulating layer 10. The gate electrode GE overlaps the channel area CA. The gate electrode GE may cross the semiconductor pattern AL on the channel area CA.

A second insulating layer 20 is disposed on the first insulating layer 10 to cover the gate electrode GE. The second insulating layer 20 may include an inorganic material, e.g., silicon oxide ($SiO_x$) or silicon nitride ($SiN_x$). The second insulating layer 20 may include a plurality of thin film layers stacked one on another.

The source electrode SE and the drain electrode DE are disposed on the second insulating layer 20. The source electrode SE is connected to the source area SA through a first contact hole CH1 formed through the second insulating layer 20 and the first insulating layer 10. The drain electrode DE is connected to the drain area DA through a second contact hole CH2 formed through the second insulating layer 20 and the first insulating layer 10.

According to another embodiment, the source electrode SE and the drain electrode DE may be disposed on the first insulating layer 10. In addition, according to another embodiment, the source electrode SE and the drain electrode DE may be disposed on different insulating layers from each other.

The heat discharge electrode HS is disposed on the second insulating layer 20. The heat discharge electrode HS is connected to the gate electrode GE through a third contact hole CH3 formed through the second insulating layer 20.

The heat discharge electrode HS receives heat generated in the thin film transistor TR from the gate electrode GE. The heat may be generated not only by the gate electrode GE but also by the semiconductor pattern AL. The heat discharge electrode HS discharges the heat to the outside. The heat transmitted to the heat discharge electrode HS may be transferred to the second insulating layer 20. Accordingly, the heat transferred to the second insulating layer 20 is discharged through the second insulating layer 20 to the outside. When a heat discharge rate of the thin film transistor TR is improved, a life span of the thin film transistor TR may be increased.

In detail, although the heat discharge electrode HS is stacked on the gate electrode GE, an area of the thin film transistor TR is not increased. The heat discharge electrode HS transfers the heat in a three-dimensional direction to discharge the heat. Therefore, the heat discharge rate of the thin film transistor TR may be higher than that of a conventional thin film transistor that discharges heat in a two-dimensional direction.

The heat discharge electrode HS is disposed between the source electrode SE and the drain electrode DE on the second insulating layer 20. The heat discharge electrode HS is spaced apart from the source electrode SE and the drain electrode DE. The heat discharge electrode HS serves as a floating electrode, and thus the heat discharge electrode HS is not connected to other electrodes except for the gate electrode GE. Thus, the heat discharge electrode HS is used only to discharge the heat and does not exert any electrical influence on the thin film transistor TR.

When the thin film transistor TR is manufactured, the heat discharge electrode HS may be formed through a same process used to form the source electrode SE and the drain electrode DE. For example, after the second insulating layer 20 is disposed on the first insulating layer 10, the first, second, and third contact holes CH1, CH2, and CH3 may be substantially simultaneously formed by a photolithography process.

Then, a conductive layer is formed on the second insulating layer 20. The first, second, and third contact holes CH1, CH2, and CH3 are filled with the conductive layer. The conductive layer is patterned by the photolithography process, and thus the heat discharge electrode HS, the source electrode SE, and the drain electrode DE are formed.

The heat discharge electrode HS, the source electrode SE, and the drain electrode DE, which are formed through the same process, include the same material. The heat discharge electrode HS, the source electrode SE, and the drain electrode DE may include at least one of aluminum and copper.

Figure 3A:
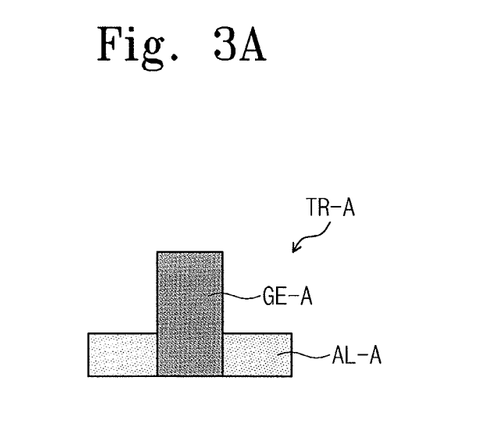
FIGS. 3A and 3B illustrate plan views showing thin film transistors having control electrodes with different shapes.
Figure 3B:
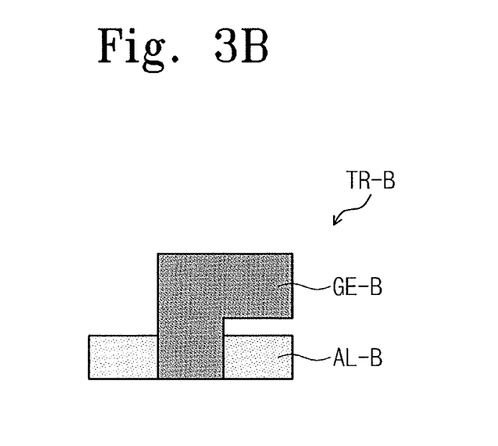
Figure 4:
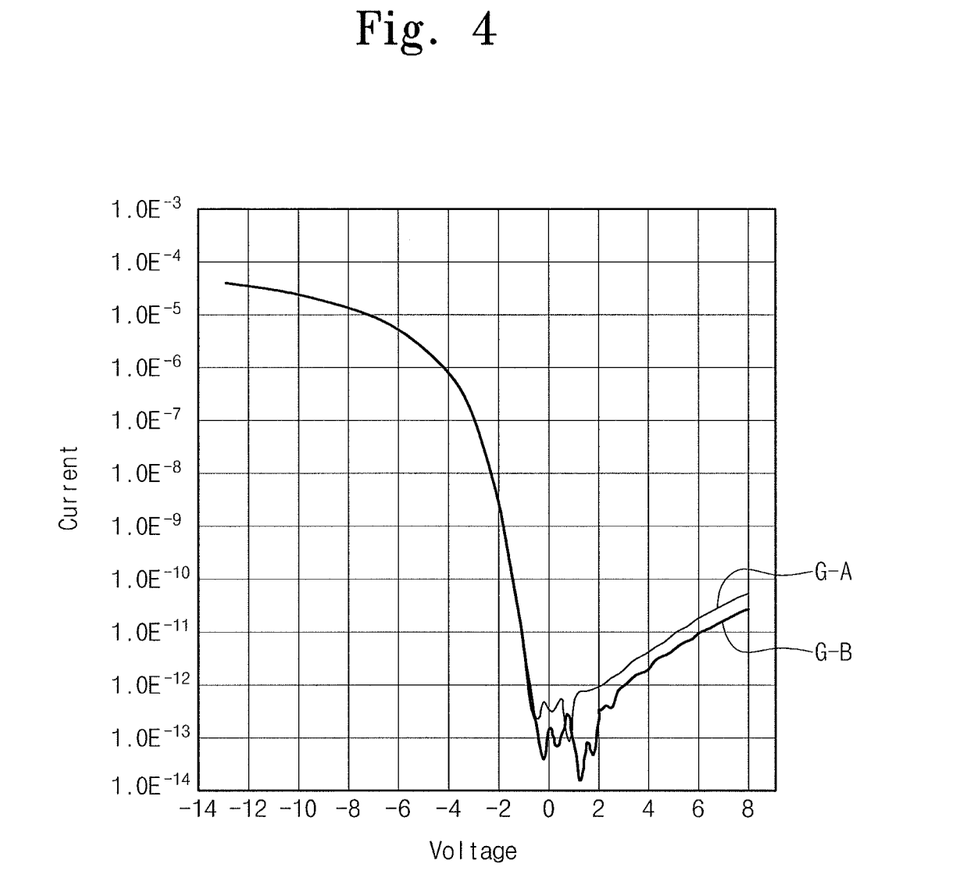
FIG. 4 illustrates a graph showing a leakage current of the thin film transistors shown in FIGS. 3A and 3B.

FIGS. 3A and 3B are plan views showing thin film transistors having control electrodes with different shapes, and FIG. 4 is a graph showing a leakage current of the thin film transistors shown in FIGS. 3A and 3B.

FIGS. 3A and 3B show only semiconductor patterns AL-A and AL-B and gate electrodes GE-A and GE-B of thin film transistors TR-A and TR-B. The gate electrode GE-B of the thin film transistor TR-B shown in FIG. 3B has an area greater than an area of the gate electrode GE-A of the thin film transistor TR-A shown in FIG. 3A.

In FIG. 4, a first graph G-A shows a voltage-current curve of the thin film transistor TR-A shown in FIG. 3A, and a second graph G-B shows a voltage-current curve of the thin film transistor TR-B shown in FIG. 3B. As shown in FIG. 4, the first graph G-A represents a leakage current greater than that of the second graph G-B in a low voltage range, e.g., about 0 volts to about 2 volts.

Heat energy generated by the thin film transistor TR-A shown in FIG. 3A is transferred to electric charges in the channel area of the thin film transistor TR-A. The electric charges in the channel area are activated by the heat energy to form a channel of the thin film transistor TR-A. The channel formed by the heat energy generates the leakage current.

By comparison, since the gate electrode GE-B of the thin film transistor TR-B shown in FIG. 3B has a greater area than that of the gate electrode GE-A of the thin film transistor TR-A shown in FIG. 3A, more heat energy is discharged from the thin film transistor TR-B shown in FIG. 3B. Accordingly, less electric charges are activated in the channel area of the thin film transistor TR-B shown in FIG. 3B, thereby generating a smaller channel and a lower leakage current.

The heat discharge electrode HS of the thin film transistor TR shown in FIGS. 1 and 2 corresponds to an increased area of the gate electrode GE relatively to the thin film transistor TR-A in FIG. 3A, and thus relatively much more heat energy is discharged from the thin film transistor TR shown in FIGS. 1 and 2 than from the thin film transistor TR-A shown in FIG. 3A. For example, the amount of heat energy discharged from the thin film transistor TR may be similar to that discharged from the thin film transistor TR-B shown in FIG. 3B. However, the gate electrode GE of the thin film transistor TR according to the present exemplary embodiment may have an area smaller than that of the gate electrode GE-B of the thin film transistor TR-B shown in FIG. 3 when viewed in a plan view. That is, the thin film transistor TR according to the present exemplary embodiment may have a high heat discharge rate.

Figure 5:
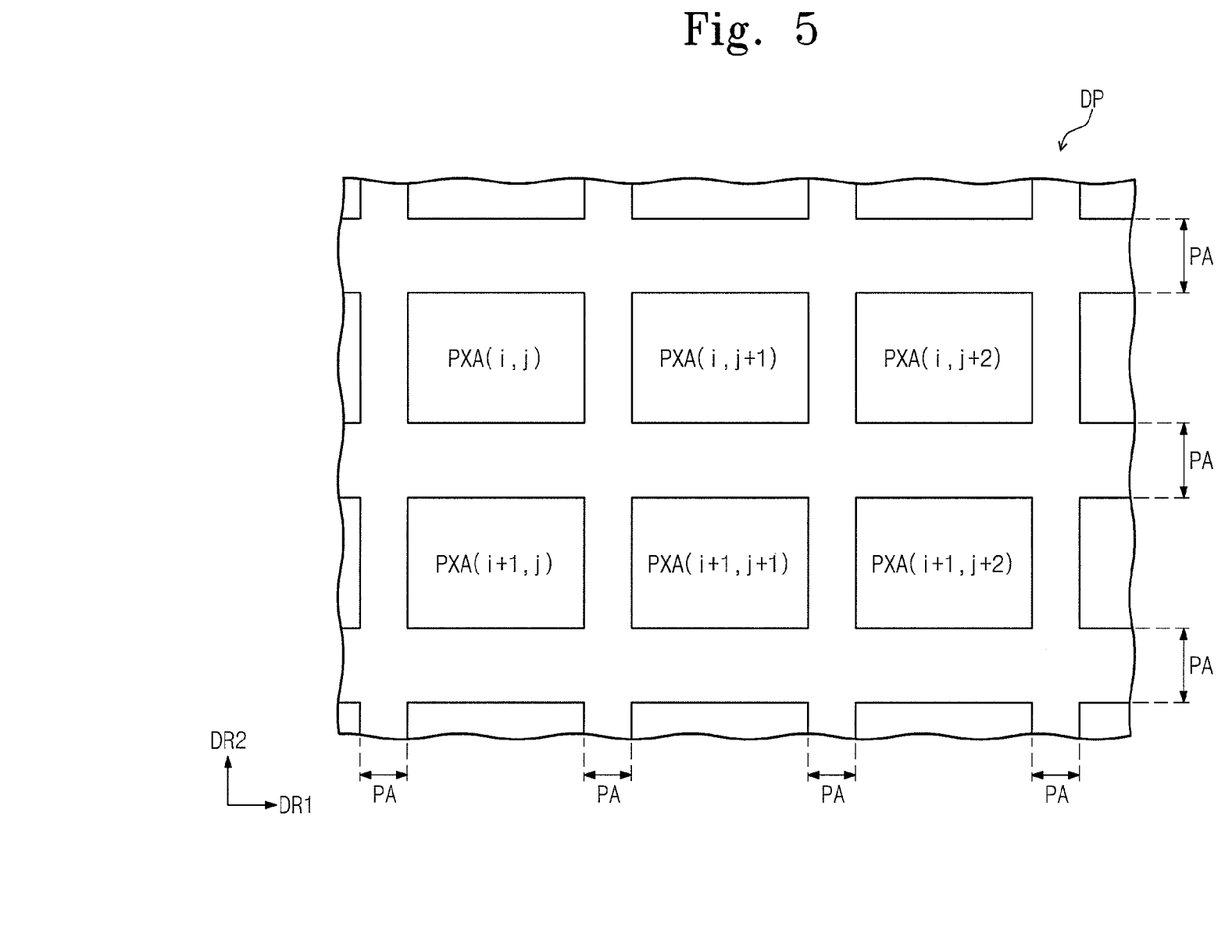
FIG. 5 illustrates a plan view showing a display device according to an exemplary embodiment of the present disclosure.
Figure 6:
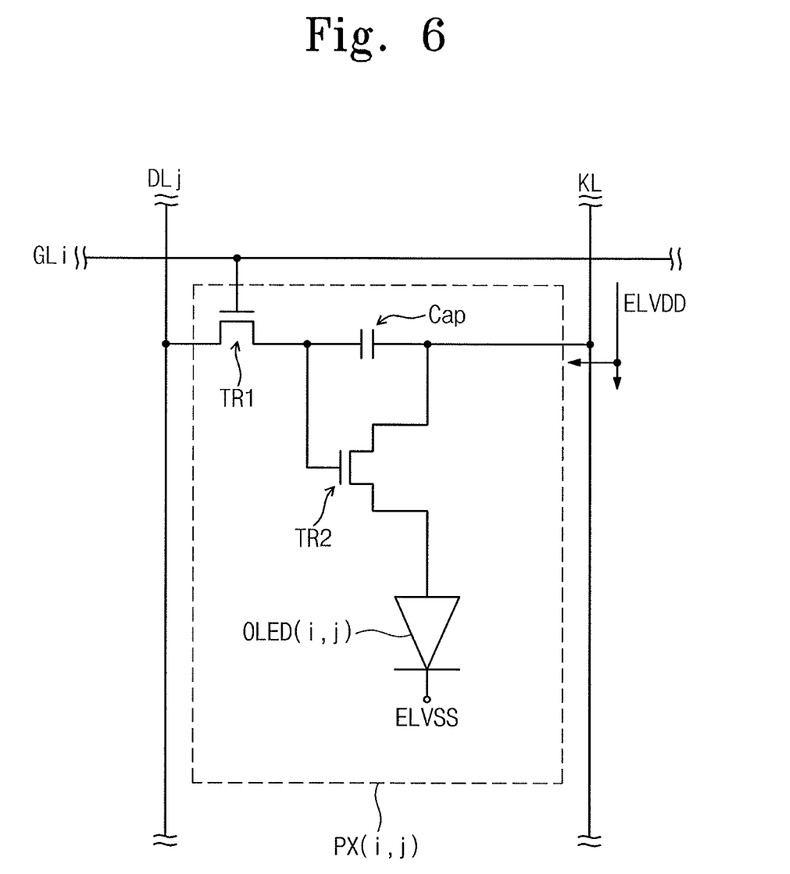
FIG. 6 illustrates an equivalent circuit diagram showing a pixel according to an exemplary embodiment of the present disclosure.

FIG. 5 is a plan view showing a display device according to an exemplary embodiment of the present disclosure, and FIG. 6 is an equivalent circuit diagram showing a pixel according to an exemplary embodiment of the present disclosure.

A display device DP may be an organic light emitting display device, and thus hereinafter, the organic light emitting display device will be described as the display device DP. The organic light emitting display device DP may include at least one base substrate and a plurality of pixels arranged on the base substrate. Each pixel may include an organic light emitting diode as a display element. In addition, each pixel may include a circuit part to control the organic light emitting diode. The circuit part includes at least one thin film transistor to apply an electrical signal to the organic light emitting diode.

Referring to FIG. 5, the organic light emitting display device DP may include a plurality of pixel areas PXA(i, j) to PXA(i+1, j+2) and peripheral areas PA disposed adjacent to the pixel areas PXA(i, j) to PXA(i+1, j+2). The pixel areas PXA(i, j) to PXA(i+1, j+2) are arranged in a matrix form. As an example, FIG. 5 shows six pixel areas PXA(i, j) to PXA(i+1, j+2).

Organic light emitting diodes of pixels are disposed in the pixel areas PXA(i, j) to PXA(i+1, j+2), respectively. Circuit parts (not shown) connected to the organic light emitting diodes and signal lines (not shown) connected to the circuit parts are disposed in the peripheral areas PA. The signal lines apply electrical signals to the pixels.

The signal lines include gate lines extending in a first direction DR1 and data lines extending in a second direction DR2 crossing the first direction DR1. The signal lines may further include a power supply line KL (FIG. 6) extending in the second direction DR2.

Different colors are displayed through three pixel areas arranged in a same row among the pixel areas PXA(i, j) to PXA(i+1, j+2). For instance, red, green, and blue colors are respectively displayed in three pixel areas of the pixel areas PXA(i, j) to PXA(i, j+2).

FIG. 6 shows the equivalent circuit diagram of the pixel PX(i, j) connected to an i-th gate line GLi and a j-th data line DLj.

Referring to FIG. 6, the pixel PX(i, j) includes a first thin film transistor TR1, a capacitor Cap, a second thin film transistor TR2, and an organic light emitting diode OLED(i, j). The first thin film transistor TR1, the capacitor Cap, and the second thin film transistor TR2 form the circuit part to control the organic light emitting diode OLED(i, j). The circuit configuration of the pixel PX(i, j) is not limited to the circuit diagram shown in FIG. 6.

The first thin film transistor TR1 outputs a data signal applied to the j-th data line DLj in response to a gate signal applied to the i-th gate line GLi. The second thin film transistor TR2 controls a driving current flowing through the organic light emitting diode OLED(i, j) in response to an amount of the electric charges charged in the capacitor Cap. The pixel PX(i, j) receives a first voltage ELVDD and a second voltage ELVSS, which have different voltage levels from each other.

The organic light emitting diode OLED(i, j) includes a first electrode applied with a voltage corresponding to the first voltage ELVDD from the second thin film transistor TR2 and a second electrode applied with the second voltage ELVSS. The organic light emitting diode OLED(i, j) emits light during a turn-on period of the second thin film transistor TR2.

According to the present exemplary embodiment, at least one of the first thin film transistor TR1 and the second thin film transistor TR2 may have a same structure as that of the thin film transistor TR described with reference to FIGS. 1 and 2. Hereinafter, the pixel PX(i, j) will be described in detail with reference to FIGS. 7 to 9.

Figure 7:
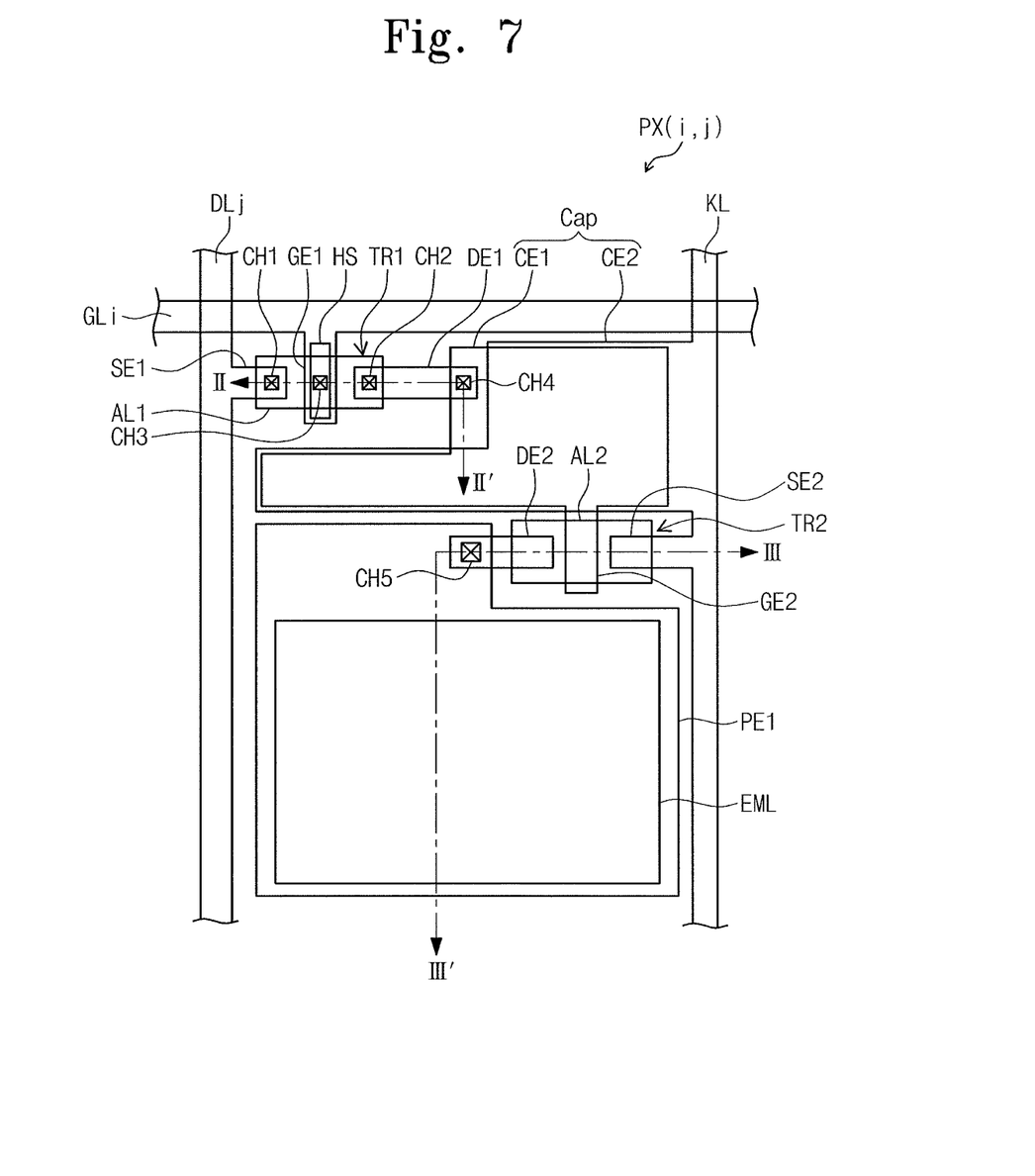
FIG. 7 illustrates a plan view showing a pixel according to an exemplary embodiment of the present disclosure.
Figure 8:
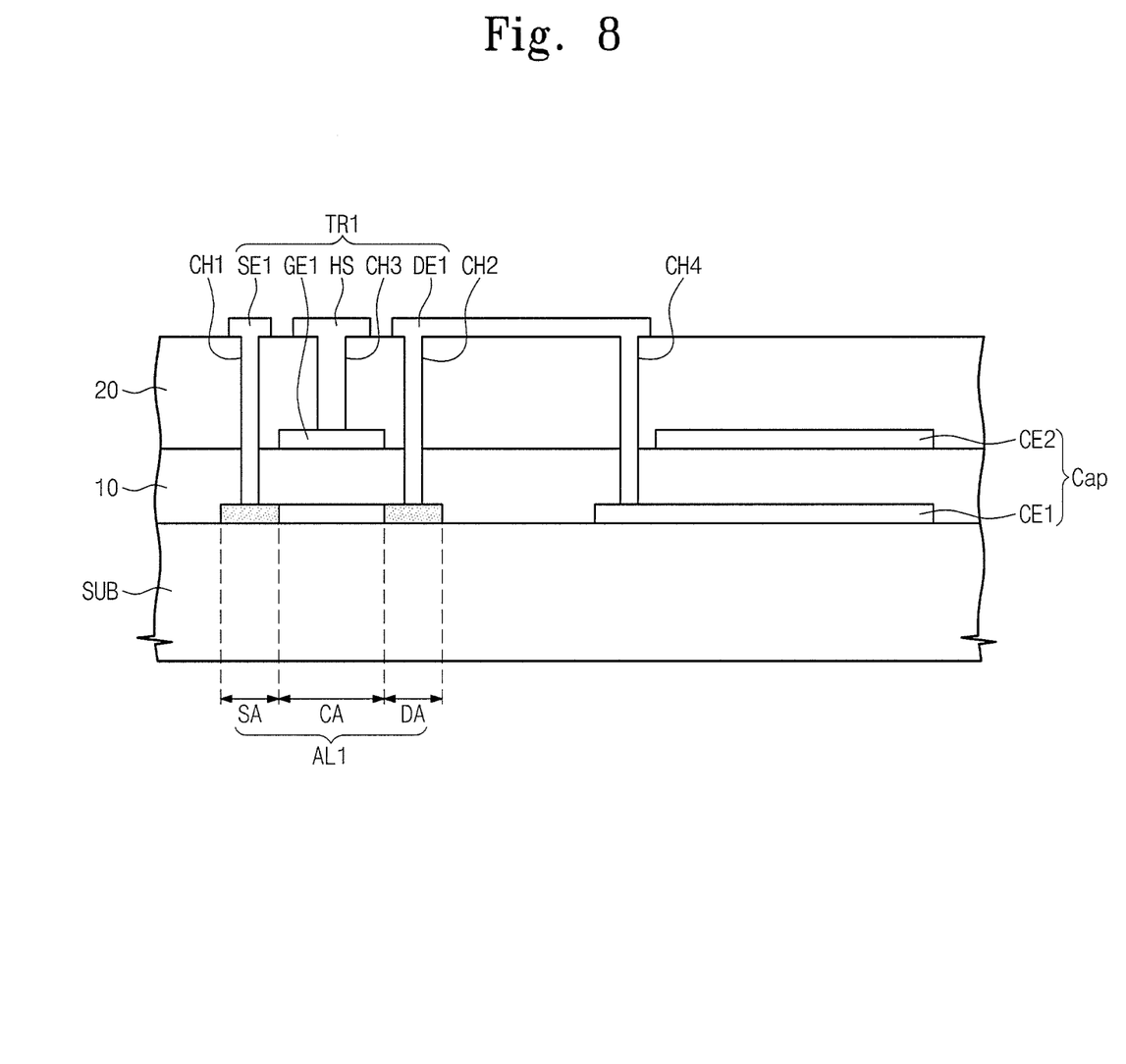
FIG. 8 illustrates a cross-sectional view showing a pixel according to an exemplary embodiment of the present disclosure.
Figure 9:
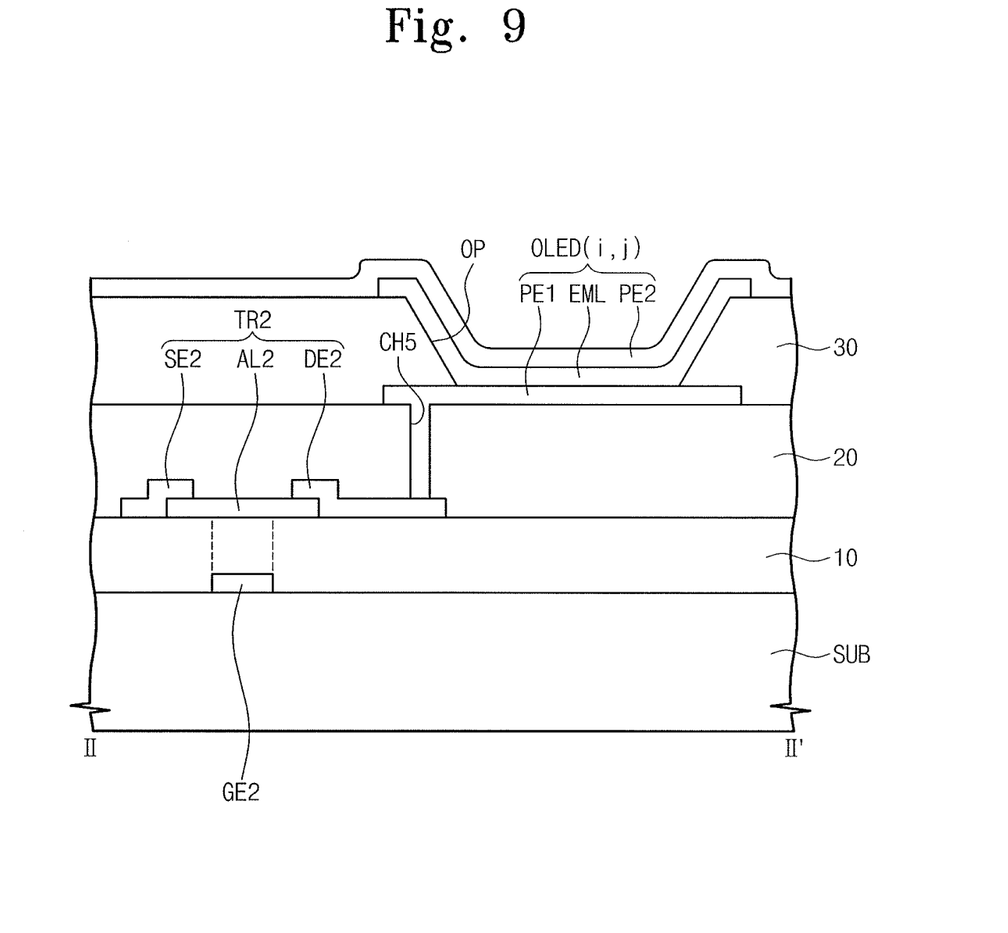
FIG. 9 illustrates a cross-sectional view showing a pixel according to an exemplary embodiment of the present disclosure.

FIG. 7 is a plan view showing the pixel PX(i, j) according to an exemplary embodiment of the present disclosure, FIG. 8 is a cross-sectional view of the pixel PX(i,j) along line II-IP of FIG. 7, and FIG. 9 is a cross-sectional view of the pixel PX(i,j) along line III-IIP of FIG. 7.

The pixel PX(i, j) is formed on the base substrate SUB. The base substrate SUB may be a glass substrate, a plastic substrate, or a stainless steel substrate.

Referring to FIGS. 7 and 8, the first thin film transistor TR1 includes a gate electrode GE1 (hereinafter, referred to as a first gate electrode), a semiconductor pattern AL1 (hereinafter, referred to as a first semiconductor pattern), a source electrode SE1 (hereinafter, referred to as a first source electrode), and a drain electrode DE1 (hereinafter, referred to as a first drain electrode). The first thin film transistor TR1 have a same structure as that of the thin film transistor TR described with reference to FIGS. 1 and 2.

The first semiconductor pattern AL1 and a first electrode CE1 of the capacitor Cap are disposed on the base substrate SUB. The first insulating layer 10 is disposed on the base substrate SUB to cover the first semiconductor pattern AL1 and the first electrode CE1. The first gate electrode GE1 branched from the gate line GLi and a second electrode CE2 of the capacitor Cap are disposed on the first insulating layer 10. The second electrode CE2 of the capacitor Cap is connected to the power supply line KL.

The second insulating layer 20 is disposed on the first insulating layer 10 to cover the first gate electrode GE1 and the second electrode CE2. The first source electrode SE1, the first drain electrode DE1, and the heat discharge electrode HS are disposed on the second insulating layer 20. The first source electrode SE1 and the first drain electrode DE1 are respectively connected to the input area SA and the output area DA through the first and second contact holes CH1 and CH2 formed through the second insulating layer 20 and the first insulating layer 10.

The heat discharge electrode HS is connected to the first gate electrode GE1 through the third contact hole CH3 formed through the second insulating layer 20. The first drain electrode DE1 is connected to the first electrode CE1 of the capacitor Cap through a fourth contact hole CH4 formed through the second insulating layer 20 and the first insulating layer 10.

The heat discharge rate of the first thin film transistor TR1 is improved by the heat discharge electrode HS, and thus the electric charges in the channel area CA may be prevented from being activated. Accordingly, the leakage current of the first thin film transistor TR1 is decreased. During a turn-off period of the first thin film transistor TR1, the organic light emitting diode OLED(i, j) does not receive any signal from the first thin film transistor TR1. Therefore, the pixel PX(i, j) may display a low gray scale approximate to a black color.

Referring to FIGS. 7 and 9, the second thin film transistor TR2 includes a gate electrode GE2 (hereinafter, referred to as a second gate electrode), a semiconductor pattern AL2 (hereinafter, referred to as a second semiconductor pattern), a source electrode SE2 (hereinafter, referred to as a second source electrode), and a drain electrode DE2 (hereinafter, referred to as a second drain electrode). The second thin film transistor TR2 has a bottom gate structure.

The second gate electrode GE2 is disposed on the base substrate SUB. The second gate electrode GE2 is connected to the first electrode CE1 of the capacitor Cap. The second semiconductor pattern AL2 is disposed on the first insulating layer 10. The second source electrode SE2 and the second drain electrode DE2 are disposed on the first insulating layer 10. Portions of the second source electrode SE2 and the second drain electrode DE2 are overlapped with the second semiconductor pattern AL2. The second source electrode SE2 is branched from the power supply line KL.

The organic light emitting diode OLED(i, j) electrically connected to the second thin film transistor TR2 is disposed on the second insulating layer 20. The organic light emitting diode OLED(i, j) includes a first electrode PE1, an organic light emitting layer EML, and a second electrode PE2. In the present exemplary embodiment, the first electrode PE1 may be an anode and the second electrode PE2 may be a cathode.

The first electrode PE1 is connected to the second drain electrode DE2 through a fifth contact hole CH5 formed through the second insulating layer 20. A third insulating layer 30 is disposed on the second insulating layer 20. The third insulating layer 30 may be an organic layer. The third insulating layer 30 is provided with an opening OP formed therethrough to expose at least a portion of the first electrode PE1

The organic light emitting layer EML makes contact with the first electrode PE1 and is disposed on an inner wall of the opening OP. The second electrode PE2 makes contact with the organic light emitting layer EML and is disposed on an upper surface of the third insulating layer 30. Although not shown in figures, a hole injection and transport layer may be further disposed between the first electrode PE1 and the organic light emitting layer EML, and an electron injection/transport layer may be further disposed between the organic light emitting layer EML and the second electrode PE2.

Figure 10:
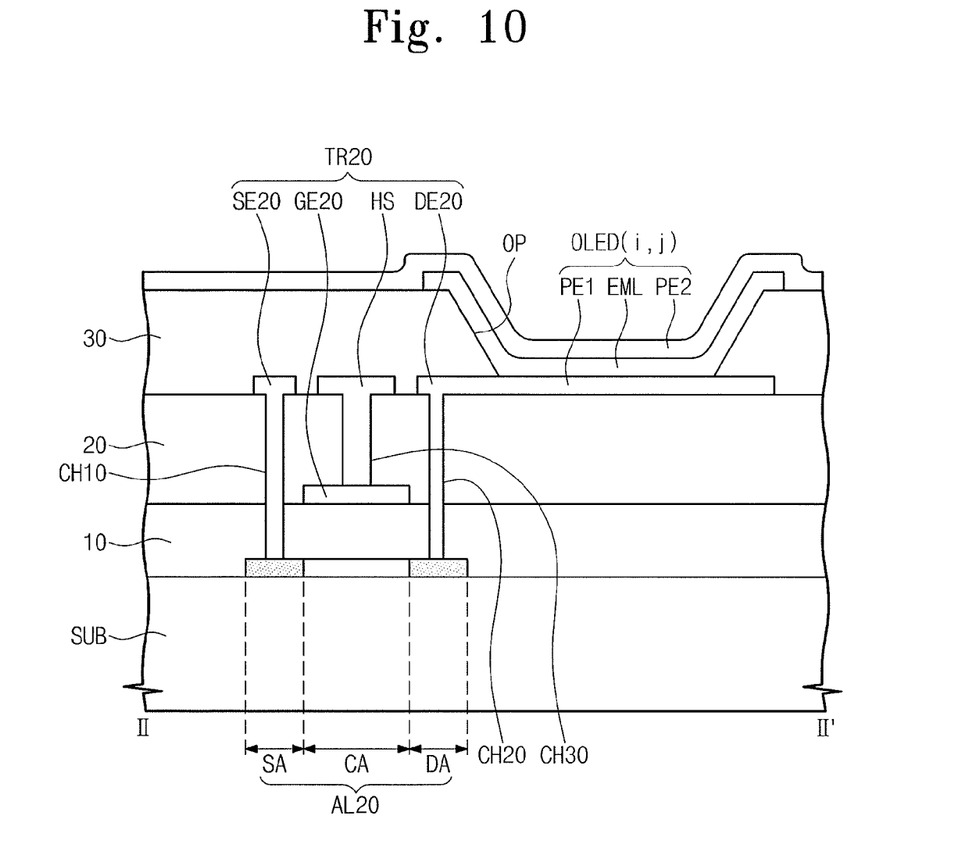
FIG. 10 illustrates a cross-sectional view showing a pixel according to an exemplary embodiment of the present disclosure.

FIG. 10 is a cross-sectional view showing a pixel according to an exemplary embodiment of the present disclosure. In the present exemplary embodiment, a second thin film transistor TR20 has the same structure as that of the thin film transistor TR described with reference to FIGS. 1 and 2.

Referring to FIG. 10, the second thin film transistor TR20 may include a second gate electrode GE20, a second semiconductor pattern AL20, a second source electrode SE20, and a second drain electrode DE20. In addition, the second thin film transistor TR20 includes a heat discharge electrode HS. The second thin film transistor TR20 may have a top gate structure.

The second semiconductor pattern AL20 is disposed on the base substrate SUB, and the second gate electrode GE20 is disposed on the first insulating layer 10. The second source electrode SE20, the second drain electrode DE20, and the heat discharge electrode HS are disposed on the second insulating layer 20. The second drain electrode DE20 is connected to the first electrode PE1 of the organic light emitting diode OLED(i, j).

The heat discharge rate of the second thin film transistor TR20 is improved by the heat discharge electrode HS, and thus the electric charges in the channel area CA may be prevented from being activated. Accordingly, the leakage current of the second thin film transistor TR20 is decreased. During a turn-off period of the second thin film transistor TR20, the driving current is not provided to the organic light emitting diode OLED(i, j). Therefore, the pixel PX(i, j) may display the low gray scale approximate to the black color.

When the second thin film transistor TR2 has the structure shown in FIG. 10, the first thin film transistor TR1 may have a structure different from the structure shown in FIG. 8. In other words, the heat discharge electrode of the first thin film transistor TR1 may be omitted and a layer structure of the first thin film transistor TR1 may be changed.

Figure 11:
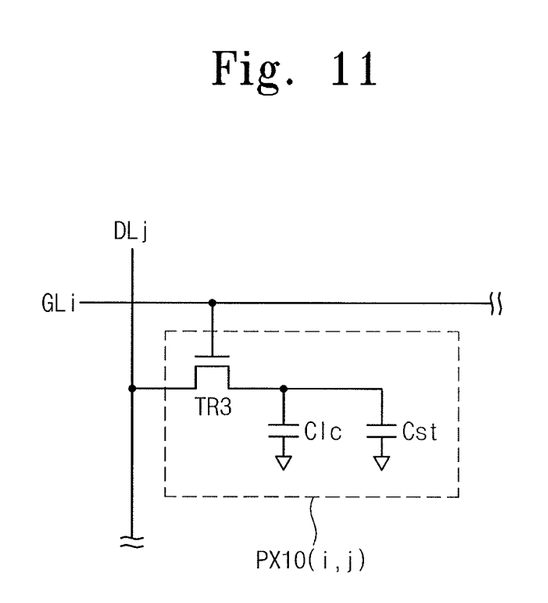
FIG. 11 illustrates an equivalent circuit diagram showing a pixel according to an exemplary embodiment of the present disclosure.

FIG. 11 is an equivalent circuit diagram showing a pixel according to an exemplary embodiment of the present disclosure. In the present exemplary embodiment, a display device may be a liquid crystal display device.

Although not shown in detail, the liquid crystal display device includes a first display substrate and a second display substrate. The first and second display substrates are disposed to be spaced apart from each other in a normal line direction thereof. A liquid crystal layer is disposed between the first and second display substrates.

The liquid crystal display device includes a plurality of pixels. The pixels transmit or block light generated by a backlight unit (not shown). Each pixel has the equivalent circuit shown in FIG. 11. A pixel PX10(i, j) includes a liquid crystal capacitor Clc as a display element and a thin film transistor TR3 as a circuit part. In addition, the pixel PX10(i, j) includes a storage capacitor Cst connected in parallel to the liquid crystal capacitor Clc. The storage capacitor Cst may be omitted.

The thin film transistor TR3 is connected to a corresponding gate line GLi and a corresponding data line DLj. The thin film transistor TR3 outputs a data signal applied to the corresponding data line DLj in response to a gate signal applied to the corresponding gate line GLi.

The liquid crystal capacitor Clc is charged with a voltage corresponding to the data signal. The liquid crystal capacitor Clc includes two electrodes and the liquid crystal layer. The two electrodes are respectively disposed on the first and second display substrates or are disposed on one of the first and second display substrates. The pixel PX10(i, j) has a transmittance determined depending on the amount of the electric charges charged in the liquid crystal capacitor Clc.

The thin film transistor TR3 has the same structure as that of the thin film transistor TR described with reference to FIGS. 1 and 2. The heat discharge rate of the thin film transistor TR3 is improved by the heat discharge electrode HS, and thus the leakage current of the thin film transistor TR3 is decreased. During a turn-off period of the thin film transistor TR3, the voltage is not applied to the liquid crystal capacitor Clc. Therefore, the pixel PX10(i, j) may display the low gray scale approximate to the black color during the turn-off period.

By way of summary and review, the present disclosure provides a thin film transistor having improved heat-discharge characteristic, and a display device having improved display quality. That is, according to embodiments, a thin film transistor includes a heat discharge electrode that receives and discharges heat generated by the thin film transistor through the gate electrode. Therefore, the life span of the thin film transistor is lengthened, since the heat is discharged through the heat discharge electrode. Further, the heat discharge electrode is stacked on the control electrode, so the area of the thin film transistor is not increased, thereby providing a thin film transistor with high heat discharge rate in a small area.

In addition, the heat discharge rate of the thin film transistor is improved by the heat discharge electrode, and thus the electric charges in the channel area may be prevented from being activated. Accordingly, the leakage current of the thin film transistor is decreased. For example, during a turn-off period of the thin film transistor, the display element does not receive any signal from the thin film transistor, and therefore, the display device may display a low gray scale approximate to a black color.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A display device, comprising:
a plurality of pixels, each of the pixels including a display element and a thin film transistor configured to apply an electrical signal to the display element, the thin film transistor including:
a semiconductor pattern on a base substrate, the semiconductor pattern including an input area, an output area, and a channel area between the input area and the output area,
a first insulating layer covering the semiconductor pattern,
a control electrode on the first insulating layer, the control electrode overlapping the channel area,
a second insulating layer covering the control electrode,
an input electrode connected to the input area,
an output electrode connected to the output area,
a heat discharge electrode on the second insulating layer, the heat discharge electrode being a floating electrode connected only to the control electrode; and
a third insulating layer covering the input electrode, the output electrode, and the heat discharge electrode.

2. The display device as claimed in claim 1, wherein the display element includes an organic light emitting diode.

3. The display device as claimed in claim 1, wherein the display element includes a liquid crystal capacitor.

4. The display device as claimed in claim 1, wherein the heat discharge electrode is connected to the control electrode through a contact hole in the second insulating layer.

5. The display device as claimed in claim 4, wherein the input electrode and the output electrode are disposed on the second insulating layer.

6. The display device as claimed in claim 5, wherein the input electrode and the output electrode are respectively connected to the input area and the output area through contact holes in the first insulating layer and the second insulating layer.

7. The display device as claimed in claim 6, wherein the heat discharge electrode is disposed between the input electrode and the output electrode on the second insulating layer and spaced apart from the input electrode and the output electrode.

8. The display device as claimed in claim 6, wherein the heat discharge electrode, the input electrode, and the output electrode include a same material.

9. A display device, comprising:
an organic light emitting diode;
a first thin film transistor configured to output a pixel voltage in response to a gate voltage;
a second thin film transistor connected to the first thin film transistor and the organic light emitting diode, the second thin film transistor being turned on in response to the pixel voltage to control a driving current flowing through the organic light emitting diode; and
a capacitor connected to the first thin film transistor and the second thin film transistor, the capacitor being configured to control a turn-on period of the second thin film transistor,
wherein at least one of the first and second thin film transistors includes:
a semiconductor pattern on a base substrate, the semiconductor pattern including an input area, an output area, and a channel area between the input area and the output area,
a first insulating layer covering the semiconductor pattern,
a control electrode on the first insulating layer, the control electrode overlapping the channel area,
a second insulating layer covering the control electrode,
an input electrode connected to the input area,
an output electrode connected to the output area,
a heat discharge electrode on the second insulating layer, the heat discharge electrode being a floating electrode connected only to the control electrode; and
a third insulating layer covering the input electrode, the output electrode, and the heat discharge electrode.

* * * * *